United States Patent [19]

Yamazaki et al.

[11] Patent Number: 5,149,990
[45] Date of Patent: Sep. 22, 1992

[54] SEMICONDUCTOR DEVICE FOR PREVENTING MALFUNCTION CAUSED BY A NOISE

[75] Inventors: Hirokazu Yamazaki, Kawasaki; Masanobu Yoshida, Yokohama, both of Japan

[73] Assignee: Fujitsu Limited, Kawasaki, Japan

[21] Appl. No.: 642,837

[22] Filed: Jan. 18, 1991

[30] Foreign Application Priority Data

Jan. 19, 1990 [JP] Japan .................................. 2-011577

[51] Int. Cl.$^5$ .................... H03K 17/16; H03K 19/003
[52] U.S. Cl. .................................. 307/443; 307/263; 307/269; 307/303; 307/491; 307/601; 307/605
[58] Field of Search ............... 307/263, 443, 605, 601, 307/269, 491, 303

[56] References Cited

U.S. PATENT DOCUMENTS 4,983,861  1/1991  Kikuchi et al. ..................... 307/443

Primary Examiner—Eugene R. LaRoche
Assistant Examiner—Michael B. Shingleton
Attorney, Agent, or Firm—Staas & Halsey

[57] ABSTRACT

A semiconductor device for absorbing a noise comprises a first and second buffer. The first and second buffers receive an external signal having a rising edge and a falling edge, and performs waveform shaping thereof to produce an output signal. The first buffer, which issues an output signal for controlling the internal circuits of a chip of the semiconductor device so as to make the chip's internal circuits active/stand-by, is not sensitive to the rising edge of the external signal, but is sensitive to the falling edge of the same external signal. The second buffer, which issues an output signal for controlling an output circuit of a chip of the semiconductor device so as to make the output circuit active/stand-by, is sensitive to both the rising and the falling edges of the external signal.

19 Claims, 9 Drawing Sheets

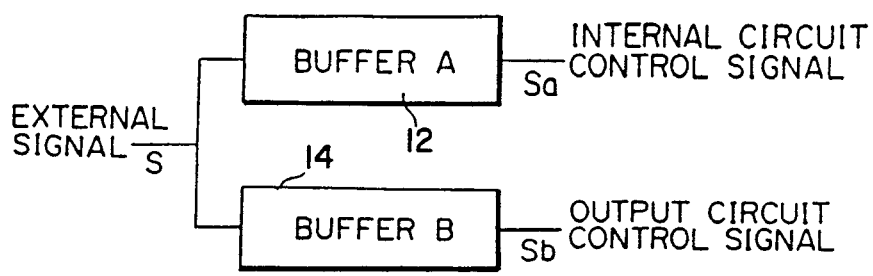
Fig. 2
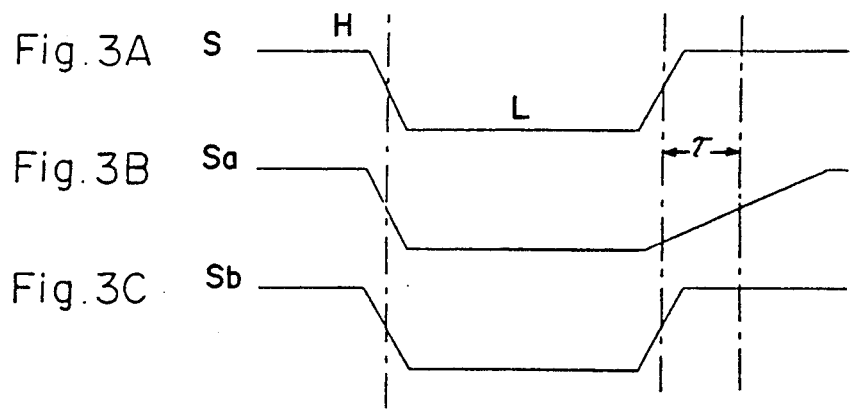
Fig. 3A  S
Fig. 3B  Sa
Fig. 3C  Sb
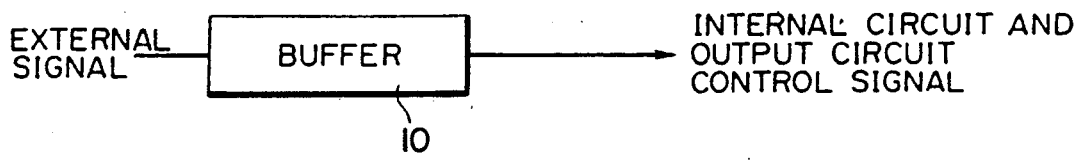
Fig. 1
PRIOR ART

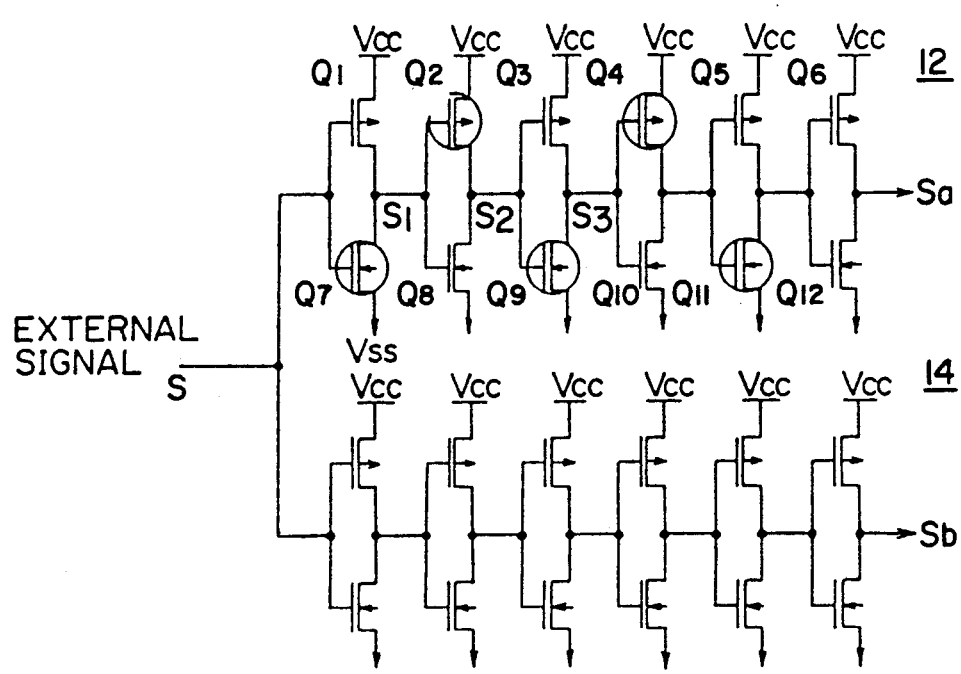
Fig. 4
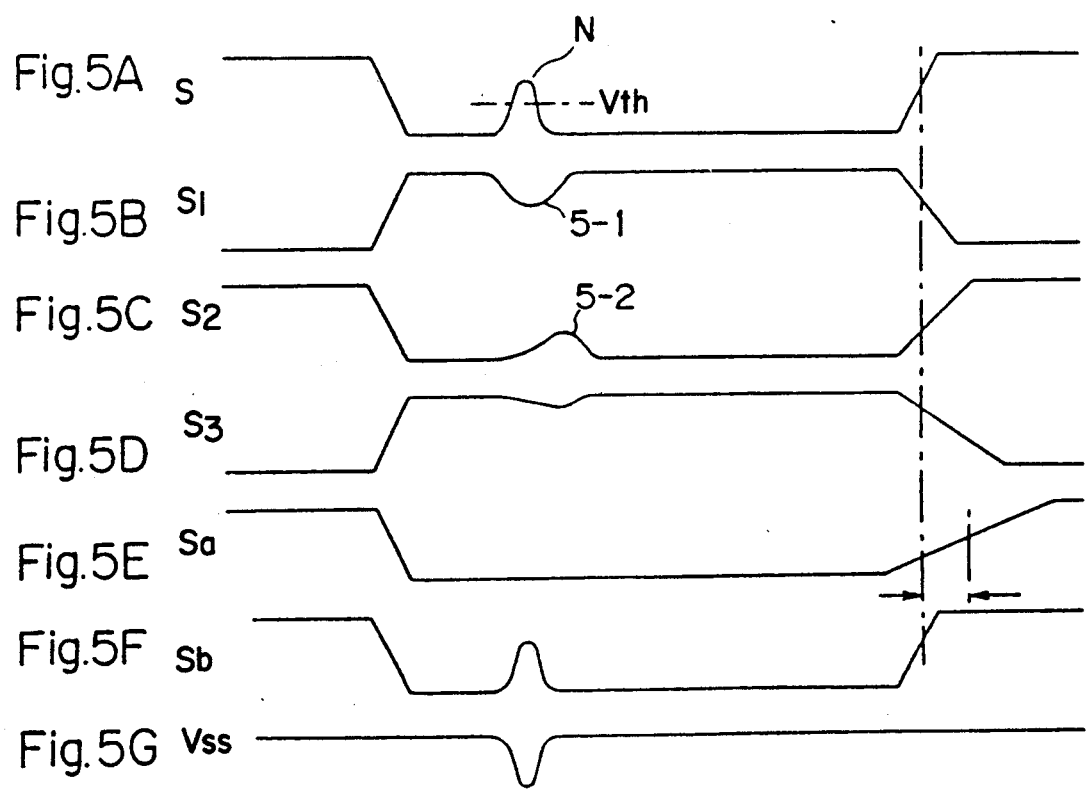
Fig.5A S
Fig.5B S1
Fig.5C S2
Fig.5D S3
Fig.5E Sa
Fig.5F Sb
Fig.5G Vss

SEMICONDUCTOR DEVICE FOR PREVENTING MALFUNCTION CAUSED BY A NOISE

BACKGROUND OF THE INVENTION

1. Field of the Invention

The present invention relates to a semiconductor device for absorbing a noise included in an external signal, and more particularly to buffers for receiving an external signal to control active/stand-by states of circuits and for shaping the waveform of the external signals.

2. Description of the Prior Art

Digital semiconductor devices such as memories and logic circuits need to be operated at high speed. To realize high speed operation, output circuits of semiconductor devices improve current-absorbing capacity and current-supply capacity to make it possible to drive a load at high speed.

However, when the load is driven at high speed, its capacitance is charged and discharged at a very high rate, thereby producing a current peak. This current peak acts on the inductive components of various wirings for supplying power to the semiconductor chip, thus causing the source voltage of the chip to vary considerably. This variation may cause the semiconductor devices to fail to function properly. Thus, measures are required to prevent such failures.

In semiconductor devices, active/stand-by control is performed to reduce power consumption. A buffer which receives an external signal to issue an output signal for performing an active/stand-by control may be caused to issue an error output signal by a variation in the chip's source voltage Vss. If it occurs, circuits may erroneously change from active state to stand-by state. Consequently, the buffer must be improved.

As shown in FIG. 1, a conventional semiconductor device or chip is provided with a single buffer for receiving an external signal for performing an active/stand-by control of the chip and for issuing an output signal to the chip's internal circuits and to its output circuit of the chip. That is, the buffer receives the external signal (chip enable signal: CE signal) and performs waveform shaping of the external signal to issue t he output or active/stand-by control signal to the chip's internal circuits and to its output circuit. This buffer 10 is constructed of a plurality of inverter stages, and is very sensitive to the external signal for minimizing the delay in the output of the active/stand-by control signal in response to the external signal. This is because it is an object of the buffer 10 to perform an active/stand-by control of the semiconductor chip. Consequently, if the external signal contains some noise, such noise is immediately issued from the buffer 10, thus causing the semiconductor chip to malfunction. In recent years, the buffer's sensitivity has been further increased along with shortening of a chip access time, thus increasing the tendency of the semiconductor chip to malfunction.

As described above, the need for high speed operation of the semiconductor chip makes the buffer for performing active/stand-by control of the chip more sensitive. Thus, the noise in the external signal tends to make the semiconductor chip malfunction.

SUMMARY OF THE INVENTION

It is an object of the present invention to provide a semiconductor device for properly performing an active/stand-by control by providing it with an active/stand-by control which is free from noise interference.

This object is accomplished by providing a semiconductor device for absorbing a noise included in an external signal input to a chip with a first and a second buffer means, each of which receives an external signal having a rising edge and a falling edge, and shapes the waveform of the external signal to produce an output signal. The first buffer means issues an output signal for controlling the chip's internal circuits to make them active and stand-by. It is not sensitive to the rising edge of the external signal, but is sensitive to the falling edge of the same external signal. The second buffer means issues an output signal for controlling an output circuit of the chip so as to make the output circuit active and stand-by. It is sensitive to both the rising and the falling edges of the external signal.

BRIEF DESCRIPTION OF THE DRAWINGS

FIG. 1 is a block diagram of a conventional control circuit;

FIG. 2 is a block diagram of a control circuit according to the principle of the present invention;

FIGS. 3A to 3C are schematic diagrams of the output signal of the control circuit shown in FIG. 2, and illustrate waveforms of the output signal;

FIG. 4 is a circuit diagram of an embodiment of the control circuit of the present invention;

FIGS. 5A to 5G are schematic diagrams of signals in the control circuit of the present invention shown in FIG. 4, and illustrate the waveforms of these signals;

DESCRIPTION OF THE PREFERRED EMBODIMENTS

Figure 6A:
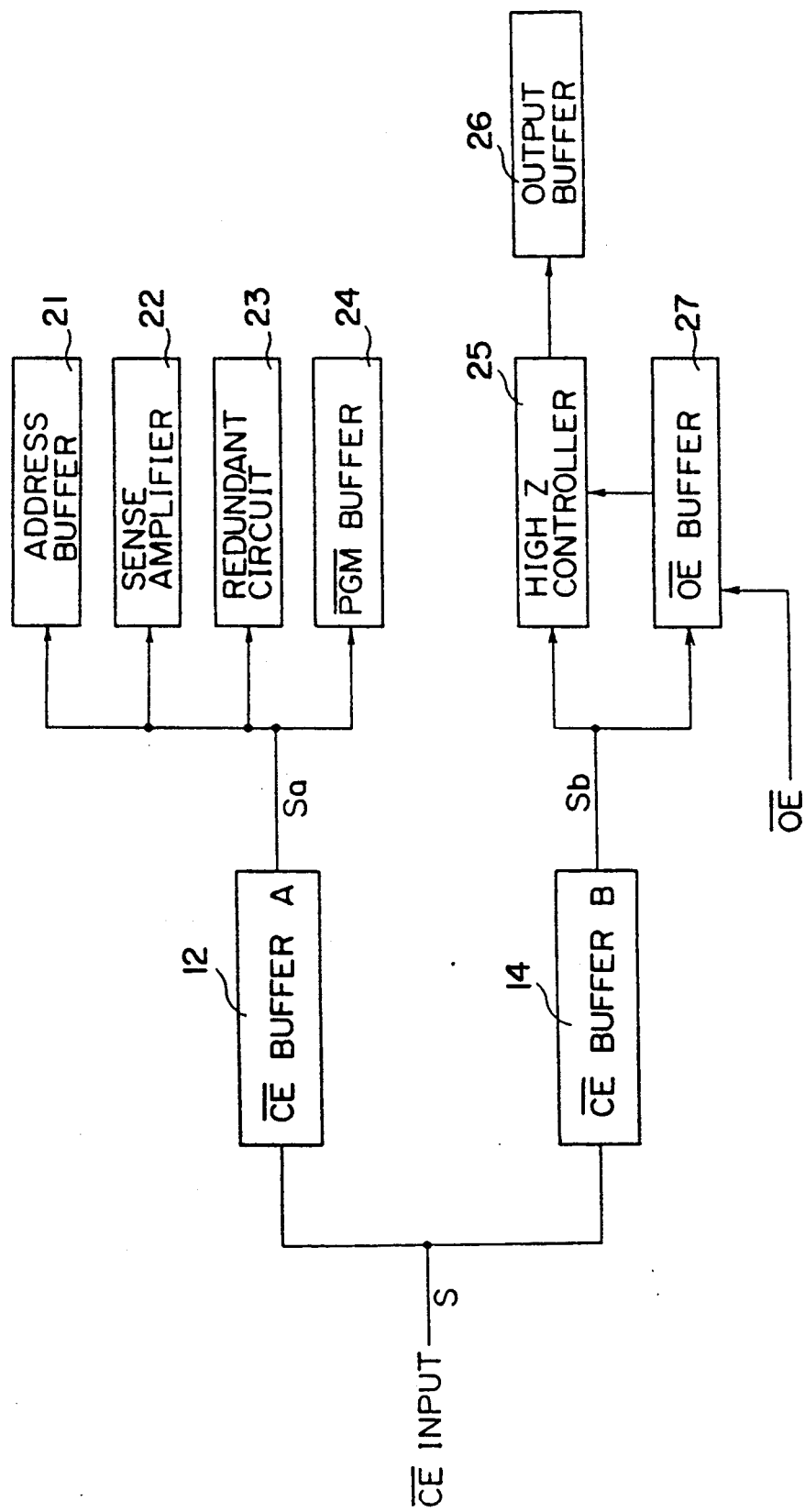
FIG. 6A is a block diagram of an embodiment of a semiconductor device according to the present invention.

Hereinbelow, an embodiment of a semiconductor device of the present invention is described in detail with reference to the accompanying drawings. The semiconductor of the present invention comprises a chip.

As shown in FIG. 2, in the semiconductor device of the present invention, a pair of buffers is provided, each of which receives an external signal for performing an active/stand-by control of the chip, and shapes the waveform of the external signal to issue an output or active/stand-by control signal. The external signal has a rising edge and a falling edge.

One of the buffers is denoted by the reference numeral 12. This buffer 12 issues an active/stand-by control signal for controlling the chip's internal circuits. The other buffer is denoted by the reference numeral 14. This buffer 14 issues an active/stand-by control signal for controlling the output circuit of the chip. That is, the buffer 12 exclusively serves the chip's internal circuits, and the buffer 14 exclusively serves the output circuit of the chip. A single buffer does not serve both of the chip's internal circuits and its output circuit, unlike in the prior art.

The buffer 12 for exclusively serving the chip's internal circuits is sensitive to the falling edge of the external signal (which makes the chip's internal circuits active), but is not sensitive to the rising edge of the same external signal (which makes the chip's internal circuit stand-by). The buffer 14 for exclusively serving the output circuit of the chip is sensitive to both the falling edge and the rising edge of the external signal.

The semiconductor device of the present invention has this construction, so that, without decreasing the chip's operational speed, it is possible to prevent it from malfunctioning even when a noise is included in the external signal.

The present invention is described in detail with reference to FIGS. 3A to 3C. In FIGS. 3A to 3C, when the external signal S changes its level H→L→H, the output signal $S_a$ of the buffer 12 and the output signal $S_b$ of the buffer 14 changes respective levels H→L→H. That is, both the falling edges of the output signals $S_a$ and $S_b$ substantially coincide in timing with the falling edge of the external signals, as in the prior art. However, unlike in the prior art, although both the rising edges of the external signal and the output signals $S_b$ substantially coincide in timing, a rising edge of the output signal $S_a$ is delayed in timing by $\tau$ relative to the rising edge of the external signal. As a result, where a noise included in the external signal S rises in the positive direction, since the buffer 12 is not sensitive to the rising edge of the external signal S, the noise is not included in the output signal $S_a$ of the buffer 12. Thus, there is no danger of the chip failing to function properly. In addition, where a noise included in the external signal S falls in the negative direction, since such noise does not interfere with the active/stand-by control of the semiconductor device, there is no danger of the noise changing the chip from active state to stand-by state. Thus, there is no problem.

Further, in the above construction of the semiconductor device of the present invention, although the response of the buffer 12 to the rising edge of the external signal S is somewhat delayed, the delayed output signal $S_a$ of the buffer 12 is employed to change the chip from active state to stand-by state. Thus, there is no problem even when the response of the buffer 12 to the rising edge of the external signal S is delayed to some extent. However, the buffer 12 is sensitive to the falling edge of the external signal S. This falling edge changes the chip from stand-by state to active state, so that there is no delay in its operational speed. The buffer 14 for exclusively serving the output circuit of the chip is sensitive to both the rising and falling edges of the external signal S. Thus, the same operational speed as for the conventional chip may be obtained at the output terminal of the chip of the present invention.

As described above, according to the present invention, it is possible to prevent the chip from malfunctioning due to noise included in the external signal, without decreasing the operational speed of the chip.

FIG. 4 shows an embodiment of the present invention. The buffers 12 and 14 are each constructed of a six-stage cascade connection of CMOS inverters. In the buffer 12, the circled transistors have a smaller drive capacity than the remaining ones. However, in the buffer 14, all the transistors have normal drive capacity (or normal dimensions). In the buffer 12, the reference characters $Q_1$ to $Q_6$ denote P-channel MOS transistors and the reference characters $Q_7$ to $Q_{12}$ denote N-channel MOS transistors. In the last stage CMOS inverter $Q_6$, $Q_{12}$, both of the transistors have normal dimensions in order to shape the waveform of the output signal $S_a$.

The present invention is described in action with reference to FIGS. 5A to 5G. As shown in FIG. 5G, when the output transistor 35 (shown in FIG. 6B) provided at the output of the semiconductor chip is switched from one state to the other, a current flows through it, thereby decreasing the level of the source voltage Vss. As shown in FIG. 5A, this produces a noise N in the external signal S as a positive pulse. As shown in FIGS. 5A and 5B, where a noise N is included in a low-level (L) external signal S, the output signal $S_1$ issued from a first stage inverter $Q_1$, $Q_7$ is the inverse of the external signal S. Thus, at a high-level output signal $S_1$, the high-level output signal $S_1$ issued from the first stage inverter $Q_1$, $Q_7$, is pulled down, as shown by reference number 5-1, toward the low level of the output signal $S_1$ in the negative direction. However, since the N-channel MOS transistor $Q_7$ whose output level is pulled down has a small drive capacity, the pull-down operation is not performed speedily. In addition, since the noise N included in the external signal S is a short-duration impulse, only a slight concave shape is formed in the waveform of the high-level output signal $S_1$.

As shown in FIG. 5C, the output signal $S_2$ issued from the second stage inverter $Q_2$, $Q_8$ has the same phase as the external signal S. Consequently, when the external signal $S_2$ is at a low level the output signal $S_2$ is also at a low level. When the output signal $S_1$ is pulled down toward its low level as shown by 5-1, the output signal $S_2$ is pulled up toward its high level as shown by reference number 5-2 when the output signal $S_2$ is at a low level. Thus, since a P-channel MOS transistor $Q_2$ for pulling up the output signal $S_2$ to a high level has a small drive capacity, this pulling up of the output signal $S_2$ is not performed immediately. Therefore, a slight convex shape is formed in the waveform of the low-level output signal $S_2$. As shown in FIG. 5D, these processes are repeated in the following stage inverters. Each of the first-, third- and fifth-stage inverters (in each of which a high-level output signal is produced in accordance with the low-level external signal S) has a small ability to pull down the level of its output signal. However, each of the second- and a fourth-stage inverters (in each of which a low-level output signal is produced in accordance with the low-level external signal S) has a small ability to pull up the level of its output signal. Consequently, as a positive noise (rising toward the high (H) level of the external signal S) included in the low (L) level of the external signal S sequentially passes through the first- to the sixth-stage CMOS inverter, delay in pulling-up/pulling-down is cumulatively increased so that the noise peak included in the output $S_a$ issued to the chip's internal circuits is, as shown in FIG. 5E, reduced to such an extent that it does not substantially interfere with the active/stand-by control of the chip's internal circuits.

On the other hand, the buffer 14 immediately responds to the external signal S to issue the output signal $S_b$ as shown in FIG. 5F. Consequently, where the noise N is included in the external signal S, it is also included in the output signal $S_b$ of the buffer 14. However, this does not cause any problem in operation. When the noise N is included in the external signal S, and is thus also included in the output signal $S_a$ the output signal $S_a$ issued to the chip's internal circuits may change the chip from active state to stand-by state, thus causing a latch circuit to be reset so that data is eliminated or abnormal data appears. However, even when the output signal $S_b$ including the noise N is issued to the output circuit of the chip and changes the output circuit of the chip from active state to stand-by state or high impedance state, only the output signal is interrupted so that there is no danger of data being eliminated.

In addition, where a negative noise is included in the high-level external signal S, there is also no problem. The negative noise may change the state of both of the chip's internal circuits and its output circuit from stand-by state to active state. This state is maintained for a very short period to permit current to flow momentarily. This does not result in malfunctioning of the chip.

The active/stand-by control of the chip's output circuit is performed with the use of the output signal $S_b$ which immediately responds to the external signal S so that there is substantially no delay in operation. It is also important for the chip to change from active state to stand-by state considering the situation that operation is switched from one chip to another.

FIG. 6A shows an embodiment of the semiconductor device of the present invention. As shown in FIG. 6, the semiconductor device of the present invention includes an address buffer 21 which receives address signal bits $A_0, A_1, A_2, \ldots$ to issue these address signal bits $\overline{A_0}, \overline{A_1}, \overline{A_2}, \ldots$ and their inverted address signal bits $\overline{A_0}, \overline{A_1}, \overline{A_2}, \ldots$; a sense amplifier 22 which amplifies a bit line potential (potential difference) appearing in a read-out; a redundant circuit 23 which replaces a failed cell so that normal operation of the semiconductor device is maintained; and a program buffer 24 for a write control signal. These components constitute the chip's internal circuits. The output signal $S_a$ issued from the buffer 12 performs the active/stand-by control of the chip's internal circuits 21, 22, 23 and 24.

The chip is also provided with other components such as a high impedance (Z) controller 25, an OE (Output Enable) buffer 27, and an output buffer 26. These components 25, 26 and 27 constitute the output circuit of the chip, the active/stand-by control whose output circuit is performed with the use of the output signal $S_b$ issued from the buffer 14.

Figure 6B:
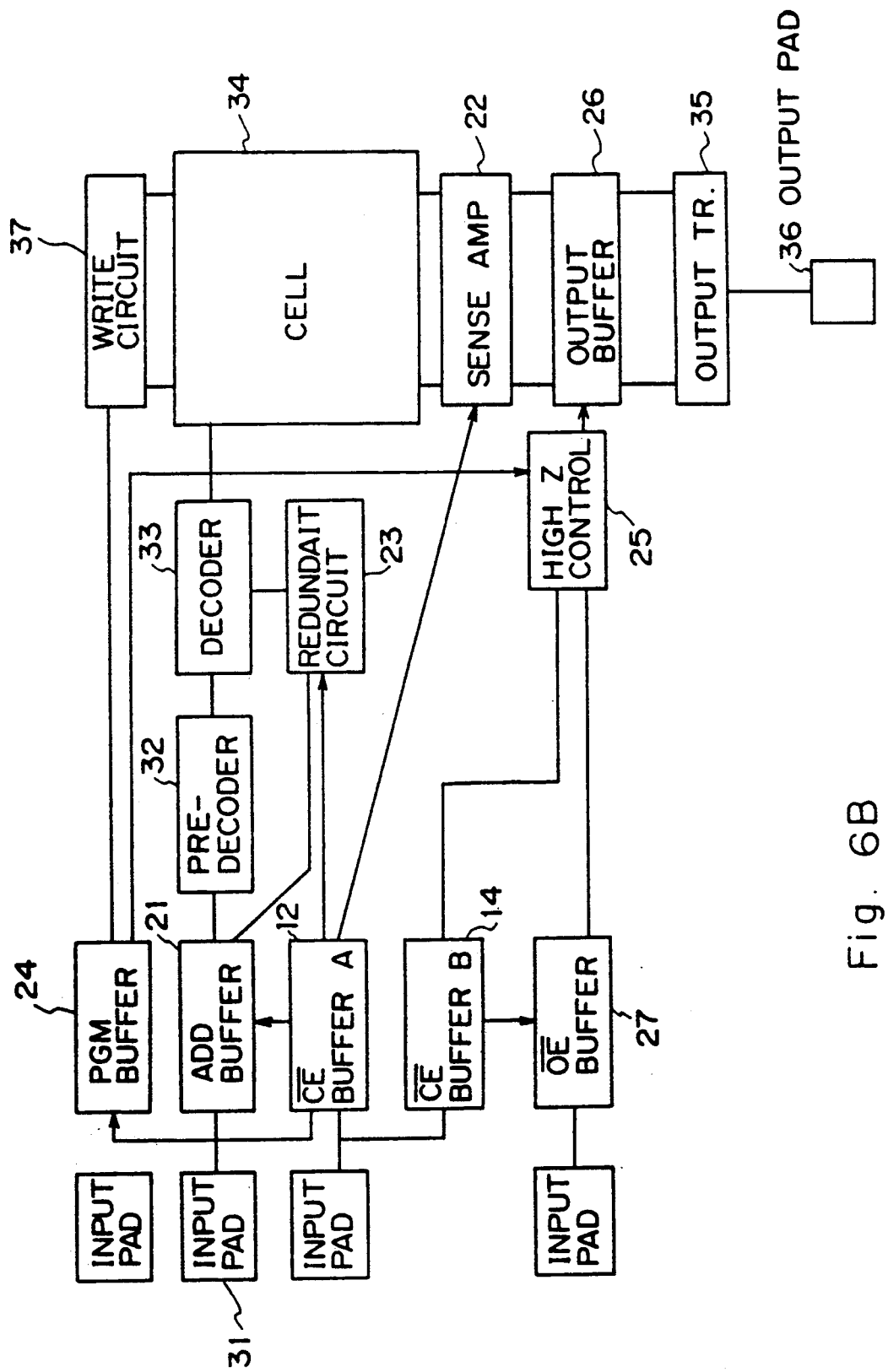
FIG. 6B is another block diagram of the embodiment of the semiconductor device according to the present invention.

In FIG. 6B, the output of the first chip enable buffer 12 is connected to the PGM buffer 24, the address buffer 21, the redundant circuit 23 and the sense amplifier 22, thereby performing an active/stand-by control of these circuits by the power down terminal (described later). An address signal from the input pad 31 is decoded through the address buffer 21, the pre-decoder 32 and the decoder 33 when the address buffer 21 is made active by the output signal of the chip enable buffer 12. Data received from the outside of the chip is written into the memory cell 34 by the write the circuit 37 when the memory cell is selected by the decoder 33. The content of the memory cell 34 which is connected to an address line decoded by the decoder 33 is detected by the sense amplifier 22 and output to the output buffer 26. When an output enable signal is supplied from the output enable buffer 14 to the output buffer 26 through the $\overline{OE}$ buffer 27 and the high impedance (Z) controller 25 then data are transmitted from the chip through the output buffer 26, the output transistor 35 and the output pad 36. The chip enable signals of the chip enable buffers 12 and 14 are made active at the low level. When the chip enable signal output from the chip enable buffers 12 and 14 are made at a high level, the whole chip is made stand-by. In this state, the power source current to be supplied to the respective internal circuit is cut off and a current is prevented from being applied to the internal circuit and is kept in a stand-by state so that the power consumption is decreased. The output signal of the chip enable buffer 12 is supplied to the power-down terminal PD of the internal circuits. The redundant circuit 23 compares an address signal input through the address buffer 21 with a fault address stored in PROM and allows the decoder 23 to make the address signal non-active when the input address accords with the fault address.

In the prior art, when a noise is included in the external signal, the output of the chip enable buffer 12 changes from active to stand-by state and then returns from the stand-by to the active state when the noise disappears, thereby providing the output data shown in FIG. 5. When the output of the chip enable buffer 12 returns from the stand-by state to the active state, an address of the memory cell 34 is newly designated by the decoder 23 through the address buffer 31, the pre-decoder 32 and the decoder 33 from the beginning. Therefore, the data read out from the memory cell 34 is delayed. In contrast, in the present invention even if a noise is included in the external signal, it is absorbed by the chip enable buffer 12 and the output of the chip enable buffer 12 does not change from the active to the stand-by state, thereby providing the output data shown in FIG. 5 and eliminating the delay of these data read from the memory cell.

The rising and falling speed of the second chip enable buffer 14 is high and thus the response to the external chip is made fast at the output portion of the chip. Therefore, in the present invention, even if the change from the active to the stand-by is delayed in the first enable buffer 12, the change from the active to the stand-by state is performed at a high speed in the output portion. Therefore, another chip connected to the data bus can occupy the data bus at a high speed after the particular chip becomes stand-by.

The relation between the active stand-by control and the chip enable buffers 12 and 14 in internal circuits and output circuits shown in FIG. 6A and 6B will be explained hereinafter.

Figure 7:
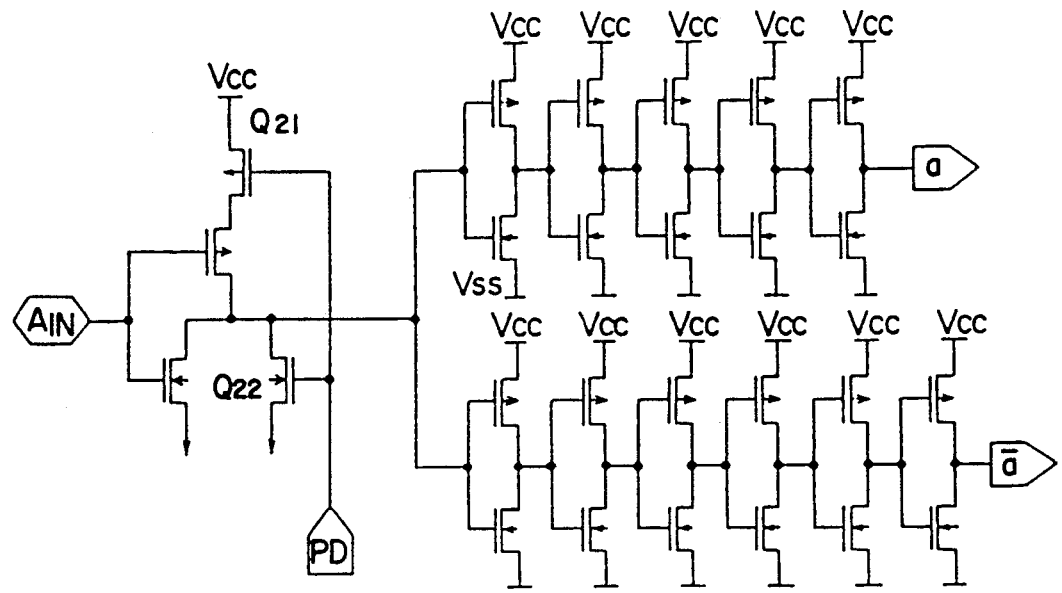
FIG. 7 is a circuit diagram of an address buffer shown in FIGS. 6A and 6B.

FIG. 7 shows a circuit diagram of an embodiment of the address buffer 21 of the semiconductor device of the present invention. In FIG. 7, the reference character $A_{IN}$ denotes an arbitrary bit of addresses $A_0, A_1, A_2, \ldots$ for obtaining access to memories. The address buffer 21 receives $A_{IN}$ to issue an inverted bit "a" and a non-inverted bit "ā". This circuit is provided for each bit of the addresses $A_0, A_1, A_2,$ terminal. When the signal applied to the power-down terminal PD, i.e. the output signal $S_a$ is in a low level, a P-channel MOS transistor $Q_{21}$ is put in the ON state and an N-channel MOS transistor $Q_{22}$ is put in the OFF state so that a first stage CMOS inverter or an address buffer is changed from stand-by state to active state. When the signal (the output signal $S_a$) applied to the PD terminal is at a high level, the P-channel MOS transistor $Q_{21}$ is put in the OFF state and the N-channel MOS transistor $Q_{22}$ is put in the ON state so that the circuit of the address buffer 21 is changed from active state to inactive or stand-by state. When the power down terminal PD is high (stand-by), transistor $Q_{21}$ turns off and the power source Vcc is cut off. Thus, a drain terminal of transistor $Q_{22}$ is fixed to "L(low level)" regardless of the logic of the address terminal $A_{IN}$ as transistor $Q_{22}$ is conductive.

In the prior art, a noise (positive pulse) is included in the chip enable signal supplied from $\overline{CE}$ buffer 12 to the power-down terminal PD during an active state (i.e., low level). Thus, the drain terminal of transistor $Q_{22}$ is turned to "L" because the power-down terminal PD becomes a stand-by state due to the noise. However, the drain terminal of transistor $Q_{22}$ should be "H(high)" upon receiving "L" input at the address terminal $A_{IN}$ during the active state, thereby resulting in that a different address is selected by decoder 33. When the chip enable signal returns to the active state after the noise disappears, the drain terminal of transistor $Q_{22}$ returns to "1" again because of a re-selecting of the address. In the prior art, the read out of data from the memory cell is delayed due to the re-selection. In contrast, the present invention does not cause the above problems because noise is not included in the chip enable signal supplied to the power-down terminal PD. An output circuit of the address buffer comprises 5 stages of CMOS inverter for providing "a" signal and 6 stages of CMOS inverter for producing "$\bar{a}$" signal.

Figure 8:
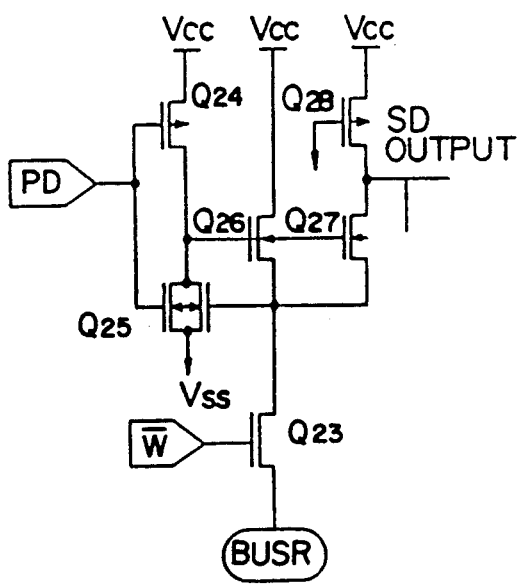
FIG. 8 is a circuit diagram of a sense amplifier shown in FIGS. 6A and 6B.

FIG. 8 shows a circuit diagram of an embodiment of the sense amplifier 22 of the semiconductor device of the present invention. In this embodiment, the sense amplifier 22 constitutes a sense amplifier for a ROM so that a plurality of bit lines, for example 32 bit lines, are connected with a terminal BUSR together with their selection gates. A W terminal serves as an input terminal through which is received a separation signal for separating the sense amplifier from the bit lines at a time when a programming (write) operation is performed. When the separation signal is received at the input terminal, a transistor $Q_{23}$ is put in the OFF state. When a low-level output signal $S_a$ is applied to the PD terminal, a P-channel transistor $Q_{24}$ is put in the ON state and an N-channel transistor $Q_{25}$ is put in the OFF state so that the sense amplifier 22 is changed from stand-by state to active state. When a current flows through the BUSR terminal during the action state, namely, the data is not stored in a memory cell to which the BUSR terminal is connected, N channel transistors $Q_{26}$ and $Q_{27}$ are on, thereby causing an SD terminal to be at a "L" level. When a current does not flow through the BUSR terminal during the active state, namely, the data is stored in a memory cell to which the BUSR terminal is connected, N channel transistors $Q_{26}$ and $Q_{27}$ are on and P channel transistor $Q_{28}$ is always on, thereby causing the SD terminal to be at "H" level. When the high-level output signal $S_a$ is applied to the PD terminal, a P-channel transistor $Q_{24}$ is put in the OFF state and an N-channel transistor $Q_{25}$ is put in the ON state so that the sense amplifier 22 is changed from active state to stand-by state. An output signal is issued from the SD terminal of the sense amplifier 22. As noise is not included in the output signal Sa according to the present invention, the sense amplifier 22 does not instantaneously change the logic of the output signal due to the noise.

Figure 9A:
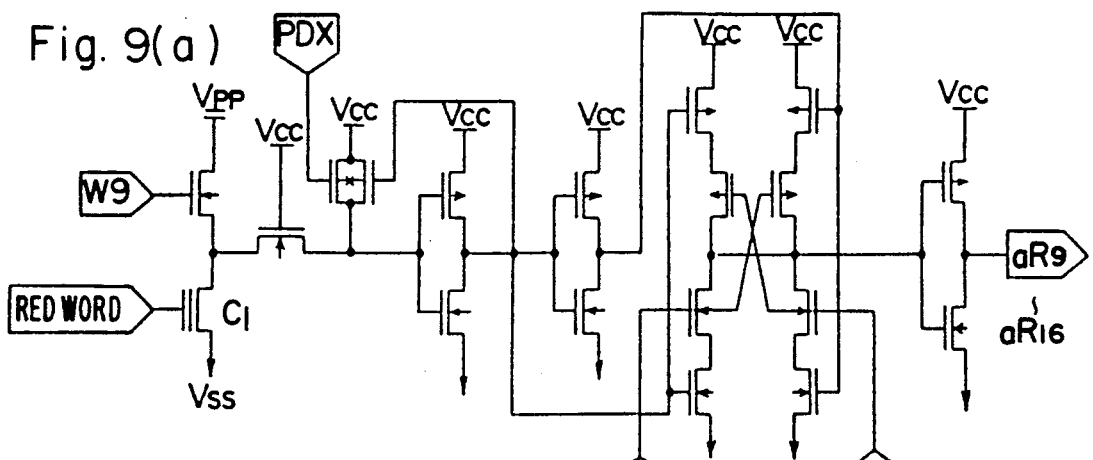
FIG. 9A-D is a circuit diagram of a redundant circuit shown in FIGS. 6A and 6B.
Figure 9B:
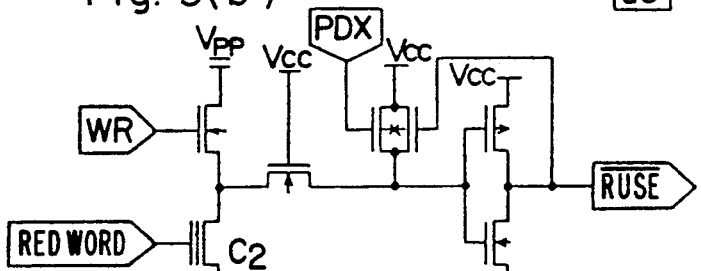
Figure 9C:
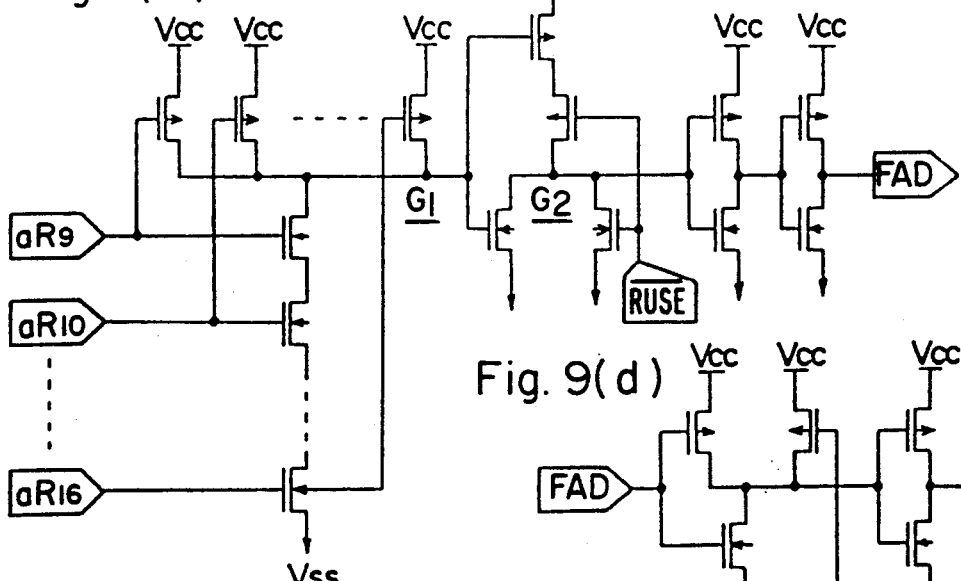

FIG. 9A to 9D show an embodiment of the redundant circuit 23 of the semiconductor device of the present invention shown in FIGS. 6A and 6B. In the redundant circuit of the embodiment shown in FIG. 9, redundant addresses (defective cell addresses) are stored in 8 bits of from a9 to a16. FIG. 9A shows the circuit for bit a9. The redundant addresses are stored in an EPROM cell $C_1$. In FIG. 9A, the reference character RED-WORD denotes a read signal for the redundant addresses. The redundant address bit $C_1$ for bit a9 is compared with memory access addresses a9, $\overline{a9}$. When they coincide, the terminal aR9 is put at a high (H) level. When write data of an electric charge, i.e., "L" is stored in EPROM cell $C_1$, the drain of EPROM cell $C_1$, becomes "H", at this time, memory access address a9 is "L" and memory access address $\overline{a9}$ is "H", thereby causing terminal a $R_9$ to be at "H" level. This shows that write data "L" coincides with the memory access address "L". When write data of an electric charge, i e., "L" is stored in EPROM cell $C_1$ the drain of EPROM cell $C_1$ becomes "H". At this time, memory access address a9 is "H" and memory access address $\overline{a9}$ is "L", thereby causing terminal a R9 to be at "L" level. This shows that write data "L" does not coincide with the memory access address "H". After each of the remaining bits coincides with its memory access address, any one of bits aR9 to aR16 is put at a high (H) level so that an output signal issued from a NAND gate $G_1$ shown in FIG. 9C is at a low (L) level and an output signal issued from a NOR gate $G_2$ is at a high (H) level and is passed through two stages of the CMOS inverters to be issued to the FAD terminal. Where an output signal issued from the FAD terminal is at a high (H) level, such output signal replaces a normal cell with a redundant cell.

A redundant address is represented by 8 bits to which a bit $C_2$ is added to indicate "redundant/not redundant" as shown in FIG. 9B, so that the total number of bits is 9. When the bit $C_2$ has been written to indicate "redundant: OFF", a $\overline{RUSE}$ terminal is put at a low (L) level so that a low (L) level output signal is issued from the $\overline{RUSE}$ terminal shown in FIG. 9B to a $\overline{RUSE}$ terminal shown in FIG. 9C. Thus, the redundant circuit shown in FIGS. 9A to 9D is changed from stand-by state to active state.

Figure 9D:
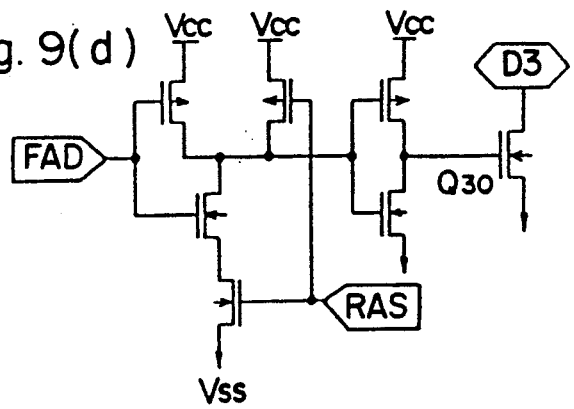

In the redundant circuit shown in FIGS. 9A to 9D, a signal issued to a terminal PDX is prepared by processing the output signal $S_a$, and is put at a low (L) level in an active state and in a rising condition of power supply $V_{cc}$. FIG. 9D shows a test circuit which employs an RAS (row address strobe) and the above FAD terminal. When the redundant address is used, $D_3$ terminal becomes high and the current flowing through transistor $Q_{30}$ is detected.

Figure 10:
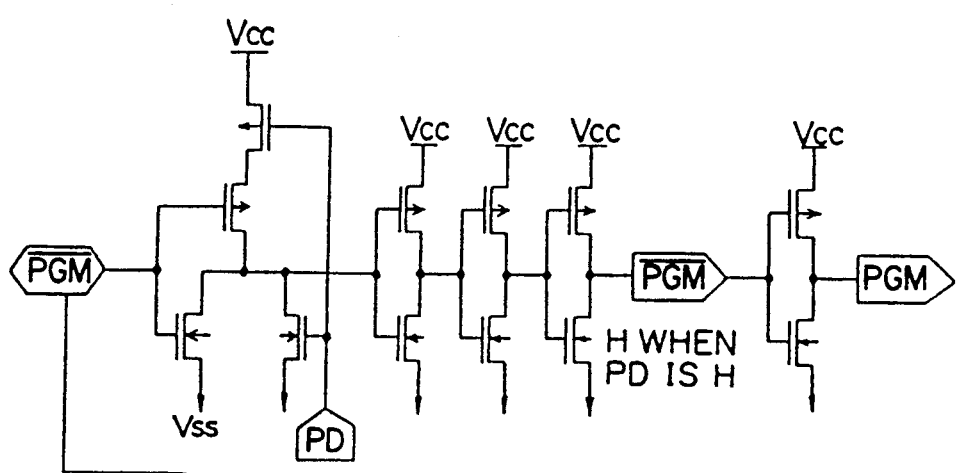
FIG. 10 is a circuit diagram of a $\overline{PGM}$ buffer shown in FIGS. 6A and 6B.

FIG. 10 shows a circuit diagram of an embodiment of the $\overline{PGM}$ buffer 24 of the semiconductor device of the present invention. The buffer 24 produces an inverted signal $\overline{PGM}$ of an external program signal $\overline{PGM}$ issued to the terminal $\overline{PGM}$; and a non-inverted signal $\overline{PGM}$ (when the PD terminal is put at a high (H) level). In addition, the buffer 24 changes a cell $V_{th}$ search signal CVTH to a high (H) level when a high voltage $V_{HH}$ is applied to the terminal $\overline{PGM}$. As the output of the first stage inverter becomes "H" in spite of the "H" input signal. The above output signal $S_a$ is applied to the PD terminal to change the PGM buffer 24 from stand-by state to active state. Only when the PD signal is low (active state), GM/ signal is transmitted as PGM signal through five inverter stages. When the PD signal is high, PGM signal is fixed to "L" at the output of the PGM buffer.

The chip's internal circuits of the semiconductor device of the present invention have the above constructions.

Figure 11:
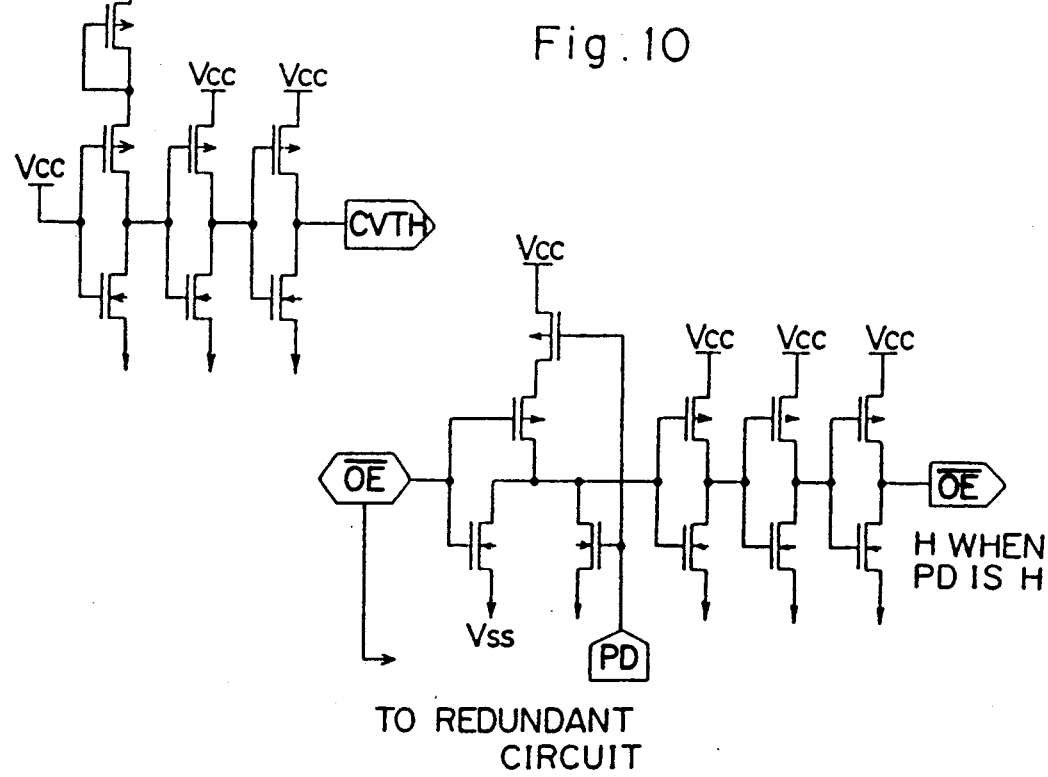
FIG. 11 is a circuit diagram of a $\overline{OE}$ buffer shown in FIGS. 6A and 6B.

FIG. 11 shows a circuit diagram of an embodiment of the $\overline{OE}$ buffer 27 of the semiconductor device of the present invention. The buffer 27 issues a signal $\overline{OE}$ when the PD terminal is at a low (L) level. This signal has the same phase as the external output enable signal applied to the terminal $\overline{OE}$. In addition, the buffer 27 is changed from active state to stand-by or inactive state when the output signal $S_b$ applied to the PD terminal is at a high (H) level, wherein the output signal OE is at a high (H) level.

Figure 12:
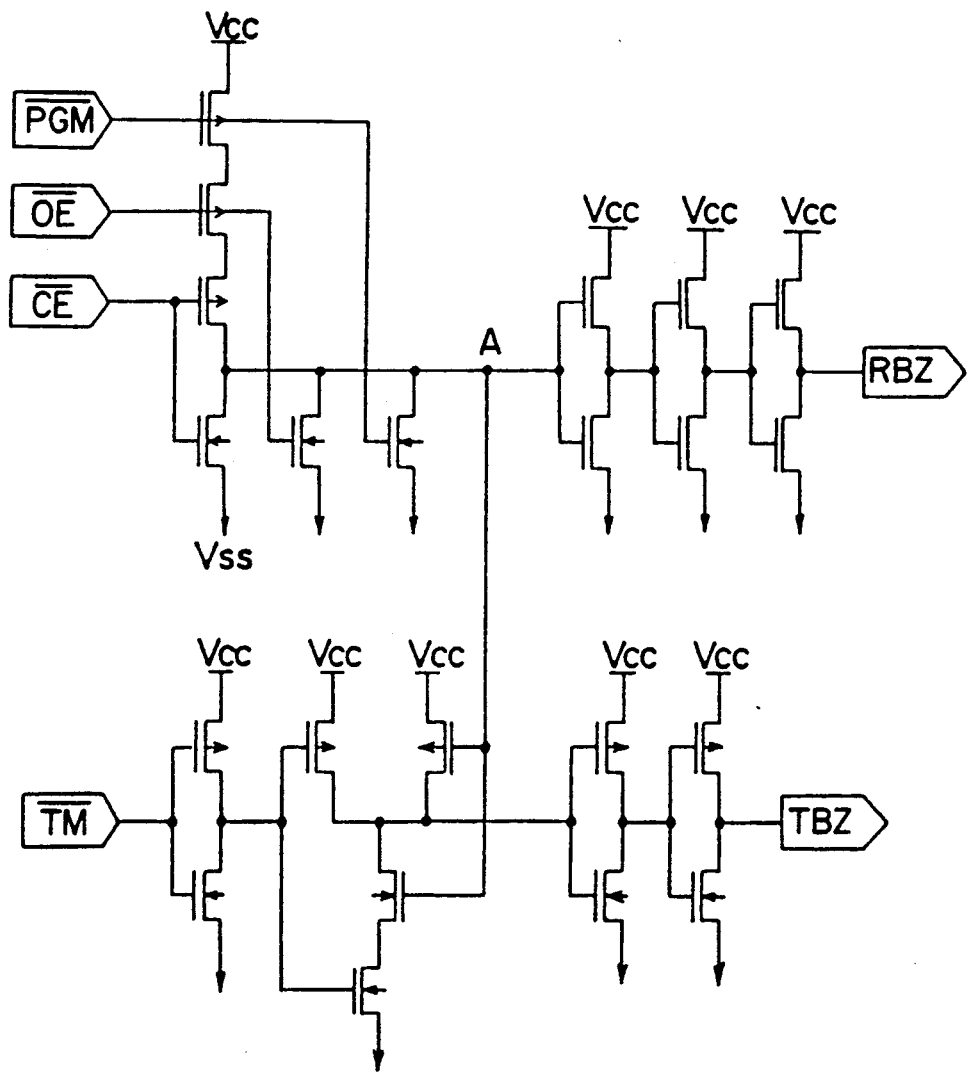
FIG. 12 is a circuit diagram of a high Z controller shown in FIGS. 6A and 6B.

FIG. 12 shows a circuit diagram of an embodiment of the high impedance (Z) controller 25 of the semiconductor device of the present invention. In the high impedance (Z) controller 25, a terminal RBZ (Real Byte High Impedance (Z)) is at a low (L) level when any of the $\overline{PGM}$ output signals shown in FIG. 10, output signal $\overline{OE}$ shown in FIG. 11 and the $\overline{CE}$ signal (i.e., the output signal $S_b$ issued from the buffer 14) is at a low (L) level. When at least one of these signals is at a high (H) level, the terminal RBZ is at a high (H) level. A terminal TBZ (Test Byte High Impedance (Z)) is employed to test the semiconductor device of the present invention. When a signal applied to a terminal $\overline{TM}$ is at a high (H) level (in x 8 operation) and even if an output terminal "A" of a NOR gate is at a high (H) level, the terminal TBZ is fixed at a high (H) level.

Figure 13:
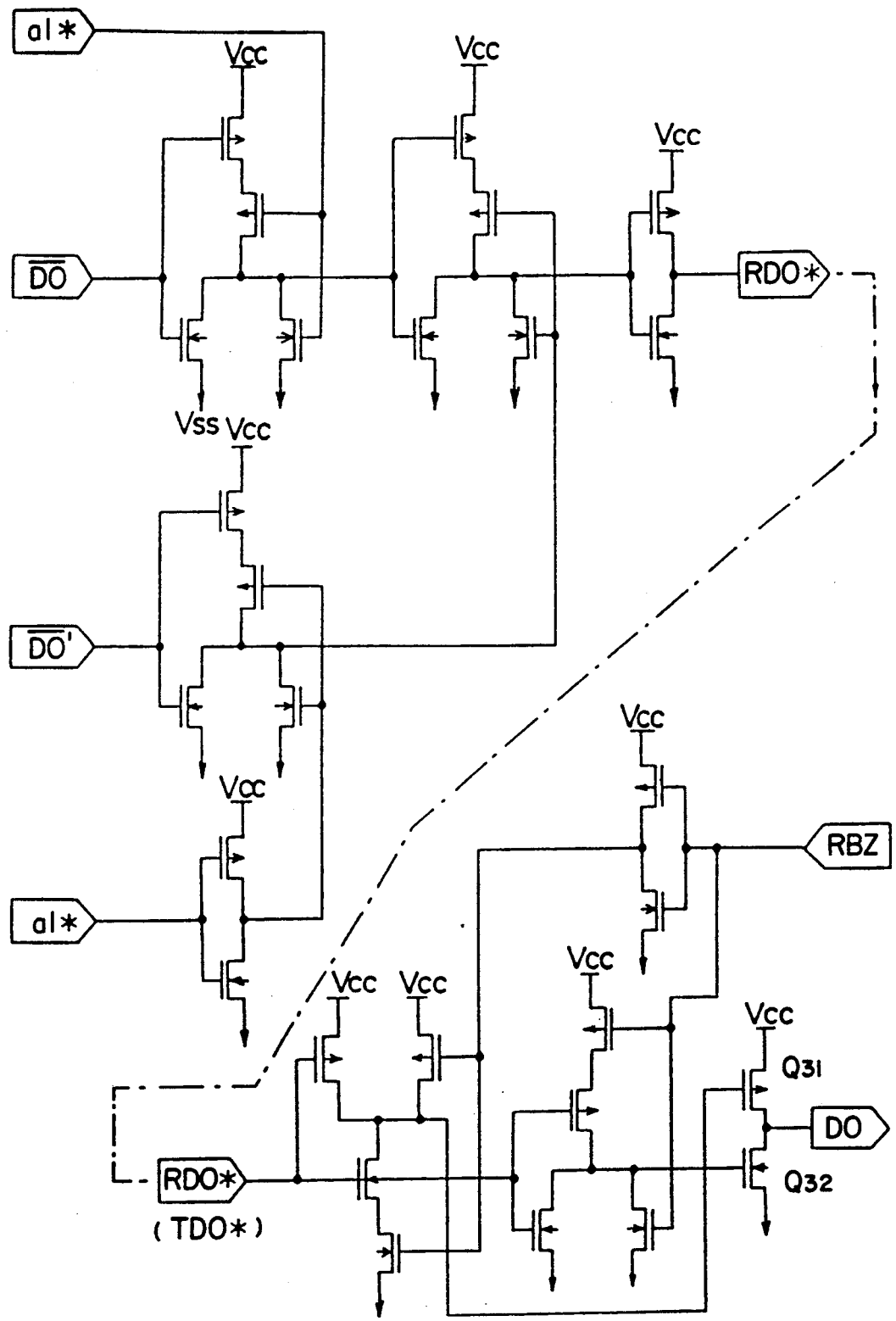
FIG. 13 is a circuit diagram of an output buffer shown in FIGS. 6A and 6B.

FIG. 13 shows a circuit diagram of an embodiment of the output buffer 26 of the semiconductor device of the present invention. The output signal D issued from the sense amplifier 22 shown in FIG. 8 is applied to a terminal DO to reach a terminal DO through a terminal RDO* so as to be issued to an external circuit. This ROM is operated in two modes: an 8-bit mode and a 16-bit mode. Thus, a signal in a terminal a1* is the same as a1 in 8-bit mode operation and is fixed at a low (L) level in 16-lower bit mode operation. $\overline{DO}$ is at a 8-bit side, and $\overline{DO}'$ is in an upper 8-bit side. $\overline{DO}'$ is also inverted through a CMOS inverter (not shown) to become TDO*, which is applied to a terminal RDO*. The output signal RBZ issued from the output buffer 26 shown in FIG. 12 is applied to the terminal RBZ to put both the P-channel transistor $Q_{31}$ and the N-channel transistor $Q_{32}$ of an output stage of the buffer 26 in OFF state, thereby enabling the output terminal DO to have a high impedance.

As is clear from the above description, the present invention makes it possible to prevent the semiconductor device from malfunctioning even when the external control signal includes some noise, since such noise is reduced in the semiconductor device of the present invention to prevent a wrong control signal from being produced. In addition, in the semiconductor device of the present invention, there is no fear of the access time being increased.

What is claimed is:

1. A semiconductor device comprising:
   first buffer means for receiving an external signal of said semiconductor device, shaping a waveform of said external signal to produce a first output signal for performing an active/stand-by control of an internal circuit of said semiconductor device, said first buffer means having a response characteristic to a change from an active state to a stand-by state of said external signal which is slower than a response characteristic to a change from said stand-by state to said active state; and
   second buffer means for receiving said external signal of said semiconductor device, shaping the waveform of said external signal to produce a second output signal for performing an active/stand-by control of an output circuit of said semiconductor device, said second buffer means having a response characteristic to a change from an active state to a stand-by state or from a stand-by state to an active state of said external signal which is faster than the response characteristic to the change from said active state to said stand-by state of said external signal in said first buffer.

2. The semiconductor device according to claim 1, wherein
   said semiconductor device comprises a memory chip and said external signal is a chip enable signal for enabling said chip.

3. The semiconductor device according to claim 1, wherein
   said first buffer means comprises a plurality of inverters each comprising a pull-up transistor and a pull-down transistor, said first one of said plurality of inverters having a pull-down transistor whose driving capacity is smaller than that of said pull-up transistor and said second one of said plurality of inverters comprising a pull-down transistor whose driving capacity is larger than that of said pull-up transistor, said first one of said plurality of inverters and said second one of said plurality of inverters being provided alternately.

4. The semiconductor device according to claim 3, wherein
   each of said plurality of inverters comprises a CMOS circuit, said pull-up transistor comprises a PMOS transistor and said pull-down transistor comprises an NMOS transistor.

5. The semiconductor device according to claim 1, wherein
   said first buffer means comprises a plurality of CMOS-circuit stages, and, when the external signal is a low active signal, a first stage CMOS circuit having an NMOS transistor whose driving capacity is smaller than that of a PMOS transistor and a second stage CMOS transistor having a PMOS transistor whose driving capacity is smaller than that of an NMOS transistor are provided alternately.

6. The semiconductor device according to claim 5, wherein
   the last stage of said CMOS circuit comprises a pull-up and a pull-down transistor with the same driving capacity.

7. The semiconductor device according to claim 1, wherein
   said internal circuit comprises a memory cell and an output portion, said first output signal of said first buffer means being an active/stand-by control signal for said internal circuit and said second output of said second buffer means being an active/stand-by control signal for said output portion.

8. The semiconductor device according to claim 7, wherein
   said internal circuit comprises an address buffer.

9. The semiconductor device according to claim 8, wherein
said address buffer comprises an input stage having a power-down terminal for making said address buffer stand by and cutting off the positive supply regardless of the logic of an input signal when said power-down terminal receives a high output signal from said first buffer means and for allowing a logic level to be formed in response to an input signal when said power-down terminal receives a low output from said first buffer means.

10. The semiconductor device according to claim 7, wherein
said internal circuit comprises a sense amplifier.

11. The semiconductor device according to claim 10, wherein
said sense amplifier comprises an input stage having a power-down terminal for making said sense amplifier stand by and cutting off a positive supply regardless of a logic of an input signal when said power-down terminal receives a high output signal from said first buffer means and for allowing a logic level to be formed in response to an input signal when said power-down terminal receives a low output from said first buffer means.

12. The semiconductor device according to claim 7, wherein
said internal circuit comprises a redundant circuit.

13. The semiconductor device according to claim 12, wherein
said redundant circuit comprises an input stage having a power-down terminal for making said redundant circuit stand by and cutting off the positive supply regardless of a logic of an input signal when said power-down terminal receives a high output signal from said first buffer means and for allowing a logic level to be formed in response to an input signal when said power-down terminal receives a low output from said first buffer means.

14. The semiconductor device according to claim 7, wherein
said internal circuit comprises a program (PGM) buffer.

15. The semiconductor device for absorbing a noise according to claim 14, wherein
said PGM buffer comprises an input stage having a power-down terminal for making said PGM buffer stand by and cutting off the positive supply regardless of a logic of an input signal when said power-down terminal receives a high output signal from said first buffer means and for allowing a logic level to be formed in response to an input signal when said power-down signal receives a low output from said first buffer means.

16. The semiconductor device according to claim 7, wherein
said output portion comprises a high impedance (Z) controller.

17. The semiconductor device according to claim 7, wherein
said output portion comprises an output enable (OE) buffer.

18. A semiconductor device comprising:
means for receiving an external signal for enabling a semiconductor chip, and
means for shaping a waveform of said external signal to produce a first output signal for performing an active/stand-by control of an internal circuit of said semiconductor device, and having a response characteristic to a change from an active state to a stand-by state of said external signal which is slower than a response characteristic to a change from the stand-by state to the active state.

19. The semiconductor device according to claim 18, wherein said chip comprises a memory device.

* * * * *